United States Patent [19]

Sakurai et al.

[11] Patent Number: 5,244,871

[45] Date of Patent: Sep. 14, 1993

[54] N-TYPE OXIDE SUPERCONDUCTOR REPRESENTED BY THE FORMULA $(ND_x(CE_yL_z))_2CUO_{4-d}$ WHERE L IS LA, MG OR A MIXTURE OF ALAKALINE EARTH ELEMENTS

[75] Inventors: Takeshi Sakurai; Toru Yamashita; Hisao Yamauchi; Shoji Tanaka, all of Tokyo, Japan

[73] Assignees: Mitsubishi Metal Corporation; Hitachi, Ltd.; International Superconductivity Technology Center, all of Tokyo, Japan

[21] Appl. No.: 772,123

[22] Filed: Oct. 9, 1991

Related U.S. Application Data

[63] Continuation of Ser. No. 520,056, May 3, 1990, abandoned.

[30] Foreign Application Priority Data

May 12, 1989 [JP] Japan ................................. 1-117261

[51] Int. Cl.$^5$ ...................... H01L 39/12; C01G 3/02; C04B 35/50
[52] U.S. Cl. ........................................ 505/1; 505/800; 505/801; 505/809; 505/810; 505/775; 505/779; 505/123; 505/126; 252/518; 252/521; 423/593
[58] Field of Search .................. 505/1, 800, 801, 809, 505/810, 775, 779; 501/123, 126; 252/518, 521; 423/593

[56] References Cited

U.S. PATENT DOCUMENTS

| | | | |
|---|---|---|---|
| 4,898,851 | 2/1990 | Michel | 505/1 |
| 4,970,197 | 11/1990 | Shiota et al. | 505/1 |
| 4,973,574 | 11/1990 | Nishio et al. | 505/1 |

FOREIGN PATENT DOCUMENTS 0380347  1/1990  European Pat. Off. .

OTHER PUBLICATIONS

Tokura et al., "A Superconducting Copper Oxide Compound with Electrons as the Charge Carriers" Nature vol. 337, pp. 345-349, Jan. 26, 1989.

Akimitsu et al., "Superconductivity in the Nd-Sr-Ce-Cu-O System," Jap. Jrnl. Appl. Phys. vol. 27, No. 10, pp. L1859-L1860, Oct. 1988.

Kosuge, "Preparation of an Almost Single Phase Superconductor in the Nd-Ce-Sr-Cu=O System," Jap. Jrnl. Appl. Phys. vol. 28, No. 1, pp. L49-L51, Jan. 1989.

Sawa et al., "A New Family of Superconducting Copper Oxides: $(Ln_{1-x}Ce_x)_2$ $(Ba_{1-y}Ln_y)_2Cu_3O_{10-\delta}$ (Ln: Nd, Sm, Eu)" Jrnl Phys Soc Jap vol. 58, No. 7 pp. 2252-2255.

Nikkei Sangyo, May 10, 1989, "Possibility Under $-173°$ C."

Sakurai et al., Physica C. Superconductivity, Oct. 15, 1989, pp. 6-8.

Kosuge, Japanese Journal of Applied Physics, Part 2, Jan. 1989, pp. 49-51.

Primary Examiner—Paul Lieberman
Assistant Examiner—Bradley A. Swope
Attorney, Agent, or Firm—Finnegan, Henderson, Farabow, Garrett & Dunner

[57] ABSTRACT

An oxide superconductor comprises a composition represented by the composition formula: $(Nd_x—Ce_y—L_z)_2CuO_{4-d}$ (wherein L is an element selected from Ca and Mg, and $x+y+z=1$). The compositions of Nd, Ce and L of the oxide superconductor corresponds to a point falling inside an area of Nd—Ce—L ternary diagram surrounded by straight lines (A-B), (B-C), (C-D) and (D-A) connecting point (A) with point (B), point (B) with point (C), point (C) with point (D) and point (D) with point (A), respectively, the points (A), (B), (C) and (D) being points ($x=1$, $y=0$, $z=0$), ($x=0.4$, $y=0.6$, $z=0$), ($x=0.4$, $y=0.3$, $z=0.3$) and ($x=0.1$, $y=0$, $z=0.9$), respectively, in the Nd—Ce—L ternary diagram. Above-described Nd—Ce—L—Cu—O oxides can exhibit superconductivity within a wide range of composition when heat-treated in an atmosphere of nitrogen.

9 Claims, 3 Drawing Sheets

5,244,871

N-TYPE OXIDE SUPERCONDUCTOR REPRESENTED BY THE FORMULA $(ND_x(CE_yL_z))_2CUO_{4-d}$ WHERE L IS LA, MG OR A MIXTURE OF ALAKALINE EARTH ELEMENTS

This application is a continuation of application Ser. No. 07/520,056, filed May 3, 1990 now abandoned.

BACKGROUND OF THE INVENTION

1. Field of the Invention

The present invention relates to oxide superconductors and processes for preparing the same, and particularly to an oxide superconductor capable of exhibiting superconductivity within a wide range of composition and a process for preparing the same.

2. Description of the Prior Art

It is known that Nd—Ce—Cu—O oxides only falling within a very narrow range of composition can show superconductivity. For instance, Tokura et al. revealed that, among oxides represented by the composition formula: $Nd_{2-a}Ce_aCuO_{4-d}$, only those within the composition range of $0.14 \leq a \leq 0.18$ can exhibit superconductivity (Y. Tokura, H. Takagi and S. Uchida: Nature, Vol. 337, pp. 345-347, 1989).

Superconductors of Nd—Ce—Cu—O system further including Sr added thereto are also under study. For instance, Akimitsu et al. reported that $Nd_{1.7}Sr_{0.4}Ce_{0.4}CuO_y$ ($Nd_2Sr_{0.5}Ce_{0.5}Cu_{1.2}O_y$) can exhibit superconductivity (J. Akimitsu et al.: Jpn. J. Appl. Phys., Vol. 27, No. 10, pp.L1859-1860, 1988), while Kosuge reported that oxides of Nd—Ce—Sr—Cu—O system can exhibit superconductivity within a very narrow range of composition, and that the superconducting transition temperature of $(Nd_{0.638}Ce_{0.087}Sr_{0.275})_2CuO_{4-d}$ is 22 K. (M. Kosuge: Jpn. J. Appl. Phys., Vol. 28, No. 1, pp.L49-51, 1989).

As described above, since oxides of Nd—Ce—Cu—O system as well as Nd—Ce—Sr—Cu—O system can exhibit superconductivity only within the very narrow range of composition, there have arisen many problems with the preparation thereof. More specifically, powders of starting materials must be very precisely weighed in the preparatory step, while mixing of the starting material powders must sometimes be effected according to a complicated method such as spray drying. Furthermore, homogenization of a composition must be effected through alternately repeated calcination and pulverization in order to prevent the superconductivity of a sinter after heat treatment from lowering due to poor homogeneity of the composition inside the sinter. Thus, many steps are required in the preparation of such an oxide superconductor.

SUMMARY OF THE INVENTION

An object of the present invention is to obviate the above-mentioned defects of the prior art, and thereby to provide novel oxide superconductors which can develop a superconducting phase within a wide range of composition to facilitate the preparation thereof.

Another object of the present invention is to provide a simple process for preparing an oxide superconductor of the kind as described above.

In accordance with one aspect of the present invention, an oxide superconductor of Nd—Ce—L—Cu—O system comprises a composition represented by the composition formula: $(Md_xCe_yL_z)_2CuO_{4-d}$ (wherein L is an element selected from Ca and Mg, and $x+y+z=1$), wherein the Nd—Ce—L composition thereof corresponds to a point falling inside an area of Nd—Ce—L ternary diagram surrounded by straight lines (A-B), (B-C), (C-D) and (D-A) connecting point (A) with point (B), point (B) with point (C), point (C) with point (D) and point (D) with point (A), respectively, the above-mentioned points (A), (B), (C) and (D) being points ($x=1$, $y=0$, $z=0$), ($x=0.4$, $y=0.6$, $z=0$), ($x=0.4$, $y=0.3$, $z=0.3$) and ($x=0.1$, $y=0$, $z=0.9$), respectively, in the Nd—Ce—L ternary diagram.

In accordance with another aspect of the present invention, an oxide superconductor of Nd—Ce—Ae—Cu—O system comprises a composition represented by the composition formula: $(Nd_xCe_yAe_z)_2CuO_{4-d}$ (wherein Ae is a combination of at least two elements belonging to Group IIa of the periodic table, and $x+y+z=1$), wherein the Nd—Ce—Ae composition thereof corresponds to a point falling inside an area of Nd—Ce—Ae ternary diagram surrounded by straight lines (A-B), (B-C), (C-D) and (D-A) connecting point (A) with point (B), point (B) with point (C), point (C) with point (D) and point (D) with point (A), respectively, the above-mentioned points (A), (B), (C) and (D) being points ($x=1$, $y=0$, $z=0$), ($x=0.4$, $y=0.6$, $z=0$), ($x=0.4$, $y=0.3$, $z=0.3$) and ($x=0.1$, $y=0$, $z=0.9$), respectively, in the Nd—Ce—M ternary diagram.

In accordance with still another aspect of the present invention, a process for preparing an oxide superconductor comprises the step of heat-treating in a reducing atmosphere an oxide sinter of the composition formula: $(Nd_xCe_yAe_z)_2CuO_{4-d}$ (wherein M is an element selected from Sr, Ca and Mg, and $x+y+z=1$), wherein the Nd—Ce—M composition thereof corresponds to a point falling inside an area of Nd—Ce—M ternary diagram surrounded by straight lines (A-B), (B-C), (C-D) and (D-A) connecting point (A) with point (B), point (B) with point (C), point (C) with point (D) and point (D) with point (A), respectively, the above-mentioned points (A), (B), (C) and (D) being points ($x=1$, $y=0$, $z=0$), ($x=0.4$, $y=0.6$, $z=0$), ($x=0.4$, $y=0.3$, $z=0.3$) and ($x=0.1$, $y=0$, $z=0.9$), respectively, in the Nd—Ce—M ternary diagram.

Here, the reducing atmosphere may be an atmosphere of nitrogen. The step of heat-treating may be effected at a temperature within a range from 950° C. to 1,100° C.

In accordance with a further aspect of the present invention, a process for preparing an oxide superconductor comprises the step of heat-treating in a reducing atmosphere an oxide sinter of the composition formula: $(Nd_xCe_yAe_z)_2CuO_{4-d}$ (wherein Ae is a combination of at least two elements belonging to Group IIa of the periodic table, and $x+y+z=1$), wherein the Nd—Ce—Ae composition thereof corresponds to a point falling inside an area of Nd—Ce—Ae ternary diagram surrounded by straight lines (A-B), (B-C), (C-D) and (D-A) connecting point (A) with point (B), point (B) with point (C), point (C) with point (D) and point (D) with point (A), respectively, the above-mentioned points (A), (B), (C) and (D) being points ($x=1$, $y=0$, $z=0$), ($x=0.4$, $y=0.6$, $z=0$), ($x=0.4$, $y=0.3$, $z=0.3$) and ($x=0.1$, $y=0$, $z=0.9$), respectively, in the Nd—Ce—Ae ternary diagram.

Here, the reducing atmosphere may be an atmosphere of nitrogen. The step of heat-treating may be effected at a temperature within a range from 950° C. to 1,100° C.

DETAILED DESCRIPTION OF PREFERRED EMBODIMENTS

The oxide superconductors according to the present invention are oxides of Nd—Ce—Cu—O system having part of Ce substituted with Ca, Mg or at least two kinds of elements belonging to Group IIa of the periodic table. However, the processes according to the present invention can be applied to a wider range of composition encompassing oxides of Nd—Ce—Cu—O system having part of Ce substituted with one kind of element belonging to Group IIa except for Ba or with at least two kinds of elements belonging to Group IIa.

Substitution of part of Ce with an element or elements belonging to Group IIa in combination with a heat treatment in a reducing atmosphere after sintering can remarkably expand the range of composition wherein a superconducting phase appears. This eliminates the need for great consideration given to weighing and mixing of powders of starting materials, simplifies the total process for the preparation of an oxide superconductor, and decreases the lot-to-lot variation in the characteristics of the oxide superconductor due to the lot-to-lot variation in the composition thereof to enable a stable superconducting material to be supplied in an industrial aspect.

The following Examples will illustrate the present invention in detail.

A description will be made of oxides of Nd—Ce—Ca—Cu—O system and oxides of the above-mentioned system having part or the whole of Ca substituted with Sr as a representative case. $Nd_2O_3$, $CeO_2$, $CaCO_3$, $SrCO_3$, and CuO were used as starting materials in the form of a powder. These starting material powders were weighed in such a way as to correspond to various compositions. The weighed starting material powders were mixed in an agate mortar for about 5 minutes, and calcined in air at 950° C. for 10 hours. The calcined powder was further pulverized and press-molded into a pellet, which was then sintered in air at 1,100° C. for 15 hours. Subsequently, the pellet was heat-treated in a stream of nitrogen in a furnace at 1,050° C. for 15 hours, and pulled out of the furnace to be quenched in a stream of nitrogen outside the furnace to room temperature. The resulting pellets with the respective various compositions were each examined by the four-probe method to find out respective variations in the electric resistance thereof with temperature.

Figure 1:
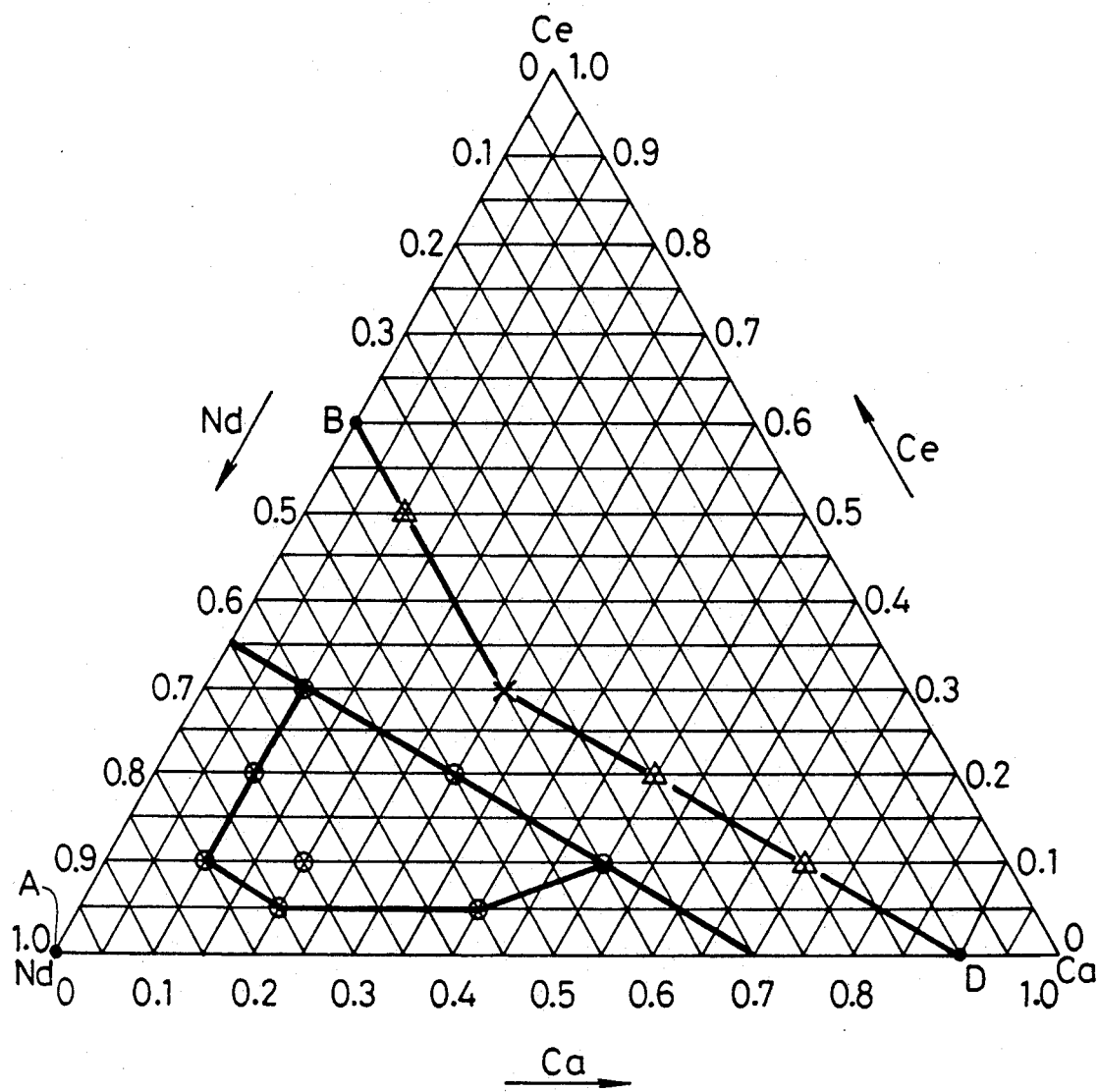
FIG. 1 is a ternary diagram illustrative of the composition range of Nd—Ce—Ca—Cu—O superconductors according to the present invention.

Table 1 shows the superconducting transition temperatures $T_{con}$ (onset temperatures) and compositions of the pellet samples of Examples, while Table 2 shows those of Comparative Examples. The pellet samples of Nd—Ce—Ca—Cu—O system of Examples 1 to 8 showed superconductivity, whereas the pellet samples of Comparative Examples 1 to 4 did not show superconductivity. Since the compositions of these samples can be represented by the composition formula: $(Nd_xCe_yCa_z)_2CuO_{4-d}$ (wherein $x+y+z=1$), they can be plotted on a Nd—Ce—Ca ternary diagram. FIG. 1 shows an area corresponding to the range of superconducting compositions of Nd—Ce—Ca—Cu—O oxides. In the figure, the marks of O correspond to compositions which showed superconductivity, the marks of X to compositions which did not show superconductivity, and the marks of Δ to compositions, the electric resistances of which could not be measured because they were too high. As is apparent from FIG. 1, the range of compositions showing superconductivity corresponds to the inside of the area surrounded by straight lines (A-B), (B-C), (C-D) and (D-A) connecting point (A) with point (B), point (B) with point (C), point (C) with point (D) and point (D) with point (A), respectively, wherein points (A), (B), (C) and (D) are points ($x=1$, $y=0$, $z=0$), ($x=0.4$, $y=0.6$, $z=0$), ($x=0.4$, $y=0.3$, $z=0.3$) and ($x=0.1$, $y=0$, $z=0.9$), respectively. It can be understood that compositions just corresponding to points falling on the straight lines (B-C) and (C-D) do not show superconductivity. The compositions corresponding to points falling on the straight lines (A-B) and (D-A) are not included in the Nd—Ce—Ca ternary systems.

The pellet samples of Examples 9 to 11, which are in the form of an Nd—Ce—Ca—Cu—O oxide falling within the superconducting composition range and having part of Ca substituted with Sr, and the pellet samples of Examples 12 and 13, which are in the form of an Nd—Ce—Ca—Cu—O oxide falling in the superconducting composition range and having the whole of Ca substituted with Sr, showed superconductivity. The pellet samples of Comparative Examples 5 to 8, 9 to 11, and 13 had the same compositions as those of Examples 1 to 4, 9 to 11, and 13, respectively, but were prepared according to a customary procedure of sintering in oxygen at 1,120° C. for 20 hours and slow cooling. These samples of Comparative Examples were an insulator or a conductor without superconductivity. Among the pellet samples of Comparative Examples subjected to a heat treatment in oxygen, there was only one pellet sample showing superconductivity, namely the sample of Comparative Example 12, which is known in the art.

TABLE 1

| Sample No. | Composition | Atmosphere during Heat Treatment | $T_{con}$ (K.) | Remarks |
|---|---|---|---|---|
| Example | | | | |
| 1 | $Nd_{1.6}Ce_{0.2}Ca_{0.2}CuO_{4-d}$ | $N_2$ | 9.0 | |
| 2 | $Nd_{1.4}Ce_{0.2}Ca_{0.4}CuO_{4-d}$ | | 11.2 | |
| 3 | $Nd_{1.5}Ce_{0.1}Ca_{0.4}CuO_{4-d}$ | | 15.0 | |
| 4 | $Nd_{1.4}Ce_{0.4}Ca_{0.2}CuO_{4-d}$ | | 9.0 | |
| 5 | $Nd_{0.8}Ce_{0.2}Ca_{1.0}CuO_{4-d}$ | | 8.0 | |
| 6 | $Nd_{1.1}Ce_{0.1}Ca_{0.8}CuO_{4-d}$ | | 17.3 | |
| 7 | $Nd_{1.0}Ce_{0.4}Ca_{0.6}CuO_{4-d}$ | | 11.0 | |
| 8 | $Nd_{1.2}Ce_{0.6}Ca_{0.2}CuO_{4-d}$ | | 8.0 | |
| 9 | $Nd_{1.4}Ce_{0.2}Ca_{0.2}Sr_{0.2}CuO_{4-d}$ | | 7.2 | |
| 10 | $Nd_{1.32}Ce_{0.27}Ca_{0.11}Sr_{0.3}CuO_{4-d}$ | | 9.7 | |
| 11 | $Nd_{1.32}Ce_{0.27}Ca_{0.11}Sr_{0.2}CuO_{4-d}$ | | 9.8 | |
| 12 | $Nd_{1.4}Ce_{0.2}Sr_{0.4}CuO_{4-d}$ | | 11.1 | |
| 13 | $Nd_{1.32}Ce_{0.27}Sr_{0.41}CuO_{4-d}$ | | 11.0 | |

TABLE 2

| Sample No. | Composition | Atmosphere during Heat Treatment | $T_{con}$ (K.) | Remarks |
|---|---|---|---|---|
| Comparative Example | | | | |
| 1 | $Nd_{0.4}Ce_{0.2}Ca_{1.4}CuO_{4-d}$ | $N_2$ | — | Insulator |
| 2 | $Nd_{0.6}Ce_{0.4}Ca_{1.0}CuO_{4-d}$ | $N_2$ | — | Insulator |
| 3 | $Nd_{0.8}Ce_{0.6}Ca_{0.6}CuO_{4-d}$ | $N_2$ | — | |
| 4 | $Nd_{0.8}Ce_{1.0}Ca_{0.2}CuO_{4-d}$ | $N_2$ | — | Insulator |
| 5 | $Nd_{1.6}Ce_{0.2}Ca_{0.2}CuO_{4-d}$ | | — | |
| 6 | $Nd_{1.4}Ce_{0.2}Ca_{0.4}CuO_{4-d}$ | | — | |
| 7 | $Nd_{1.5}Ce_{0.1}Ca_{0.4}CuO_{4-d}$ | | — | Insulator |
| 8 | $Nd_{1.4}Ce_{0.4}Ca_{0.2}CuO_{4-d}$ | | — | Insulator |
| 9 | $Nd_{1.4}Ce_{0.2}Ca_{0.2}Sr_{0.2}CuO_{4-d}$ | $O_2$ | — | |
| 10 | $Nd_{1.32}Ce_{0.27}Ca_{0.11}Sr_{0.3}CuO_{4-d}$ | | — | |
| 11 | $Nd_{1.32}Ce_{0.27}Ca_{0.21}Sr_{0.2}CuO_{4-d}$ | | — | |
| 12 | $Nd_{1.4}Ce_{0.2}Sr_{0.4}CuO_{4-d}$ | | 21.8 | |
| 13 | $Nd_{1.32}Ce_{0.27}Sr_{0.41}CuO_{4-d}$ | | — | |

Next, a description will be made of oxides of Nd—Ce—Mg—Cu—O system and oxides of the above-mentioned system having part of Mg substituted with other element belonging to Group IIa. $Nd_2O_3$, $CeO_2$, $MgCO_3$, $BaCO_3$, $SrCO_3$ and CuO were used as starting materials in the form of a powder. These starting material powders were weighed, mixed together, calcined, and press-molded in the same manner as in the foregoing case of the Nd—Ce—Ca—Cu— oxides. The resulting pellets with respective various compositions were sintered in air at 1,100° C. for 15 hours, heat-treated in a stream of nitrogen in a furnace at 1,050° C. for 15 hours, and then pulled out of the furnace to be quenched in a stream of nitrogen outside the furnace to room temperature. The resulting pellets with the respective various compositions were each examined by the four-probe method to find out respective variations in the electric resistance thereof with temperature.

Table 3 shows the superconducting transition temperature $T_{con}$ (onset temperatures) and compositions of the pellet samples of Examples together with those of Comparative Examples. The compositions of these samples shown in Table 3 can be represented by the composition formula: $(Nd_xCe_yMg_z)_2CuO_{4-d}$ (wherein $x+y+z=1$) or $(Nd_xCe_yAe_z)_2CuO_{4-d}$ (wherein Ae is a combination of at least two elements belonging to Group IIa, and $x+y+z=1$). The pellet samples of Examples 14 to 22, which showed superconductivity, correspond to points falling inside the area surrounded by the straight lines (A-B), (B-C), (C-D) and (D-A) in the ternary diagram of FIG. 1 wherein Ca should be regarded as Mg or Ae in this case.

TABLE 3

| Sample No. | Composition | $T_{con}$ (K.) | Remarks |
|---|---|---|---|
| Example | | | |
| 14 | $Nd_{1.8}Ce_{0.1}Mg_{0.1}CuO_{4-d}$ | 15.7 | |
| 15 | $Nd_{1.2}Ce_{0.2}Mg_{0.6}CuO_{4-d}$ | 14.9 | |
| 16 | $Nd_{0.8}Ce_{0.2}Mg_{1.0}CuO_{4-d}$ | 15.5 | |
| 17 | $Nd_{1.2}Ce_{0.6}Mg_{0.2}CuO_{4-d}$ | 13.9 | |
| 18 | $Nd_{1.8}Ce_{0.1}Mg_{0.05}Ba_{0.05}CuO_{4-d}$ | 7.4 | |
| 19 | $Nd_{1.2}Ce_{0.2}Mg_{0.3}Ba_{0.3}CuO_{4-d}$ | 8.3 | |
| 20 | $Nd_{1.8}Ce_{0.1}Mg_{0.05}Sr_{0.05}CuO_{4-d}$ | 11.7 | |
| 21 | $Nd_{1.2}Ce_{0.2}Mg_{0.3}Sr_{0.3}CuO_{4-d}$ | 9.8 | |
| 22 | $Nd_{1.2}Ce_{0.6}Mg_{0.1}Sr_{0.1}CuO_{4-d}$ | 12.9 | |
| Comparative Example | | | |
| 14 | $Nd_{0.8}Ce_{1.0}Mg_{0.2}CuO_{4-d}$ | — | Insulator |
| 15 | $Nd_{0.8}Ce_{0.2}Mg_{0.5}Sr_{0.5}CuO_{4-d}$ | — | |
| 16 | $Nd_{0.8}Ce_{1.0}Mg_{0.1}Sr_{0.1}CuO_{4-d}$ | — | Insulator |

The fact that superconductors could be obtained within such a wide range of composition according to the present invention is attributable to substitution of part of Ce of $Nd_{2-a}Ce_aCuO_{4-d}$ with Ca, Mg or at least two elements belonging to Group IIa of the periodic table in combination with a heat treatment in a stream of nitrogen. Only sintering in an atmosphere containing oxygen according to the customary method does not provide superconductivity for most of $Nd_{2-a}Ce_aCuO_{4-d}$ oxides even having part of Ce substituted with Ca, Mg or at least two elements belonging to Group IIa. In contrast, a heat treatment in a stream of nitrogen after sintering remarkably expands the range of composition showing superconductivity. It was found out through X-ray diffractometry that the pellet samples which showed superconductivity had a crystal structure corresponding to N-type electric conduction. Accordingly, the reason for the foregoing expansion of the range of composition showing superconductivity is believed to be that a heat treatment in nitrogen allows nitrogen to act as such a reducing atmosphere as can strip an oxide of some oxygen atoms to increase the number of electrons as carries. The amount of oxygen must be large in common P-type superconductors, which, therefore, needs the use of silver outer cylinders when formed into wires. In contrast, N-type superconductors can be used even when covered with a cheap metal incapable of feeding thereto oxygen later, such as copper and aluminum, because a small amount of oxygen therein will suffice. The heat treatment temperature is preferably in the range of 950° C. to 1,100° C. Further, quenching in a stream of nitrogen can sharpen the drop of the electric resistance of the resulting oxide superconductor when cooled below the onset temperature thereof. The process can be simplified by effecting sintering in nitrogen after calcination.

Figure 2:
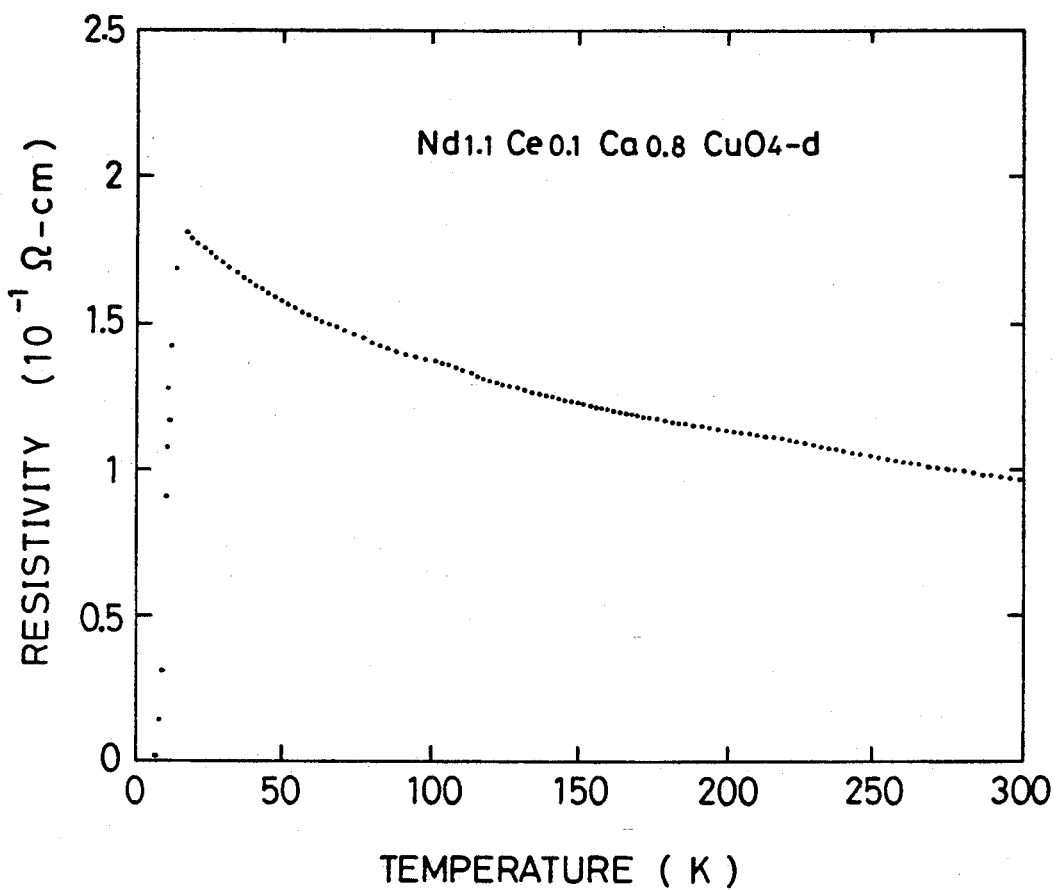
FIGS. 2 and 3 are resistivity versus temperature characteristic diagram of respective oxide superconductors according to the present invention.
Figure 3:
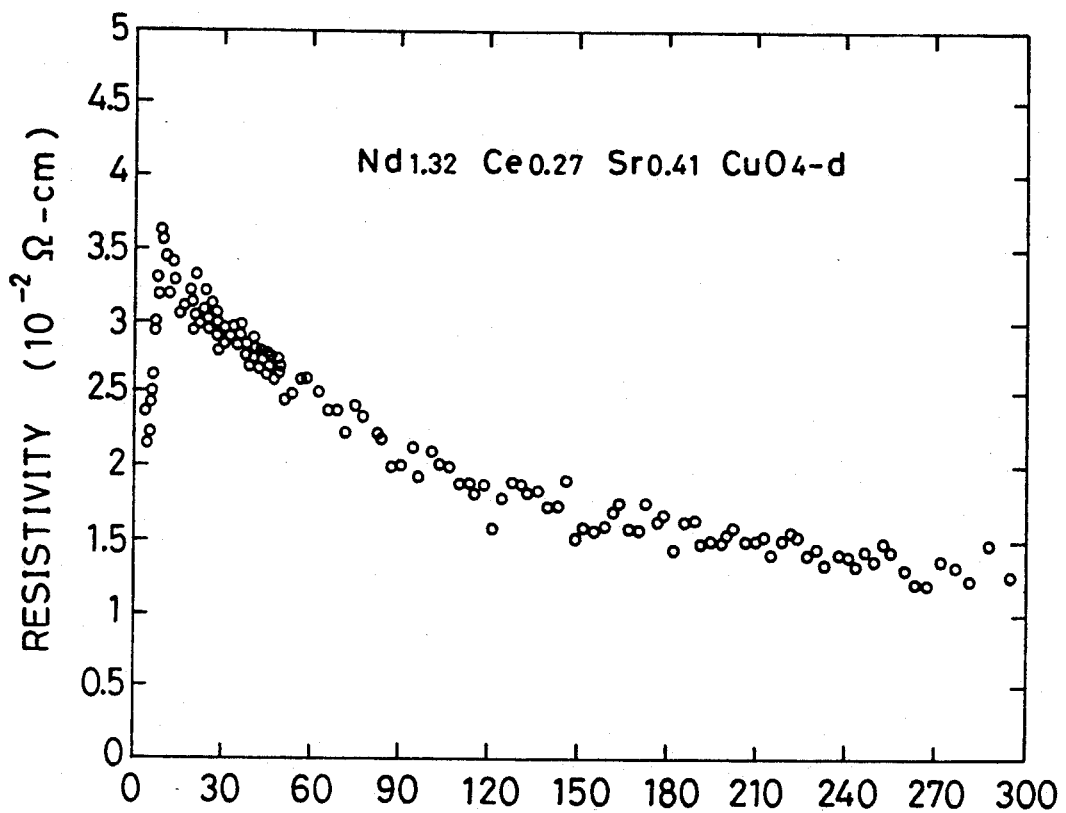

FIGS. 2 and 3 show resistivity versus temperature characteristics of oxides with compositions: $Nd_{1.1}Ce_{0.1}Ca_{0.8}CuO_{4-d}$ and $Nd_{1.32}Ce_{0.27}Sr_{0.41}CuO_{4-d}$, respectively, by way of example. Both of the oxides had an onset temperature higher than 10 K., and showed a sharp drop of electric resistance below the transition temperature.

As described hereinbefore, according to the present invention, substitution of part of Ce of an Nd—Ce—Cu—O oxide with an element or elements belonging to Group IIa of the periodic table in combination with a heat treatment in a reducing atmosphere after sintering can remarkably expand the range of composition showing superconductivity. This can simplify the method of weighing and mixing powders of starting materials, and eliminate the need of alternately repeat sintering and pulverization to prevent the unhomogeneity of the resulting composition. According, the process can be simplified with a shortened preparation time to lower the cost of preparation of an oxide superconductor.

The invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. An N-type oxide superconductor of Nd—Ce—L—Cu—O system comprising:
a composition represented by the composition formula: $(Nd_xCe_yL_z)_2CuO_{4-d}$, where L is an element selected from Ca and Mg and where $x+y+z=1$, wherein the Nd—Ce—L composition thereof corresponds to a point falling inside an area of Nd—Ce—L ternary diagram surrounded by straight lines A—B, B—C, C—D and D—A connecting point A with point B, point B with point C, point C with point D and point D with point A, respectively, said points A, B, C and D being points $(x=1, y=0, z=0)$, $(x=0.4, y=0.6, z=0)$, $(x=0.4, y=0.3, z=0.3)$ and $(x=0.1, y=0, z=0.9)$, respectively, in said Nd—Ce—L ternary diagram.

2. An N-type oxide superconductor of Nd—Ce—L—Cu—O system as claimed in claim 1, wherein said Nd—Ce—L composition corresponds to a point falling inside an area of said Nd—Ce—L ternary diagram surrounded by straight lines A—E, E—F and F—A connecting point A with point E, point E with point F and point F with point A, respectively, said point E and F being points $(x=0.65, y=0.35, z=0)$ and $(x=0.3, y=0, z=0.7)$, respectively.

3. An N-type oxide superconductor of Nd—Ce—L—Cu—O system as claimed in claim 2, wherein said element L is Ca.

4. An N-type oxide superconductor of Nd—Ce—L—Cu—O system as claimed in claim 3, wherein said Nd—Ce—L composition is within a range surrounded by straight lines G—H, H—I, I—J, J—K and K—G connecting point G with point H, point H with point I, point I with point J, point J with point K and point K with point G, respectively, said points G, H, I, J and K being points $(x=0.8, y=0.1, z=0.1)$, $(x=0.6, y=0.3, z=0.1)$, $x=0.4, y=0.1, z=0.5)$ and $(x=0.55, y=0.05, z=0.4)$, and $(x=0.75, y=0.05, z=0.2)$, respectively.

5. An N-type oxide superconductor of Nd—Ce—L—Cu—O system as claimed in claim 1, wherein said element L is Mg and said oxide superconductor is an oxide selected from the group consisting of $Nd_{1.8}Ce_{0.1}Mg_{0.1}CuO_{4-d}$, $Nd_{1.2}Ce_{0.2}Mg_{0.6}CuO_{4-d}$, $Nd_{0.8}Ce_{0.2}Mg_{0.1}CuO_{4-d}$ and $Nd_{1.2}Ce_{0.6}Mg_{0.2}CuO_{4-d}$.

6. An N-type oxide superconductor of Nd—Ce—Ae—Cu—O system comprising:
a composition represented by the composition formula: $(Nd_xCe_yAe_z)_2CuO_{4-d}$, where Ae is a combination of at least two elements selected from the group consisting of Ca, Mg, Sr and Ba and where $x+y+z=1$, wherein the Nd—Ce—Ae composition thereof corresponds to a point falling inside an area of Nd—Ce—Ae ternary diagram surrounded by straight lines A—B, B—C, C—D and D—A connecting point A with point B, point B with point C, point C with point D and point D with point A, respectively, said points A, B, C and D being points $(x=1, y=0, z=0)$, $(x=0.4, y=0.6, z=0)$, $(x=0.4, y=0.3, z=0.3)$ and $(x=0.1, y=0, z=0.9)$, respectively, in said Nd—Ce—Ae ternary diagram.

7. An N-type oxide superconductor of Nd—Ce—Ae—Cu—O system as claimed in claim 6, wherein said Ae is a combination of one of Ca and Mg and one of Sr and Ba.

8. An N-type oxide superconductor of Nd—Ce—Ae—Cu—O system as claimed in claim 6, wherein said oxide superconductor is an oxide selected from the group consisting of
$Nd_{1.4}Ce_{0.2}Ca_{0.2}Sr_{0.2}CuO_{4-d}$,
$Nd_{1.32}Ce_{0.27}Ca_{0.11}Sr_{0.3}CuO_{4-d}$,
$Nd_{1.32}Ce_{0.27}Ca_{0.21}Sr_{0.2}CuO_{4-d}$.

9. An N-type oxide superconductor of Nd—Ce—Ae—Cu—O system as claimed in claim 6, wherein said oxide superconductor is an oxide selected from the group consisting of
$Nd_{1.8}Ce_{0.1}Mg_{0.05}Ba_{0.05}CuO_{4-d}$,
$Nd_{1.2}Ce_{0.2}Mg_{0.3}Ba_{0.3}CuO_{4-d}$,
$Nd_{1.8}Ce_{0.1}Mg_{0.05}Sr_{0.05}CuO_{4-d}$,
$Nd_{1.2}Ce_{0.2}Mg_{0.3}Sr_{0.3}CuO_{4-d}$ and
$Nd_{1.2}Ce_{0.6}Mg_{0.1}Sr_{0.1}CuO_{4-d}$.

* * * * *

UNITED STATES PATENT AND TRADEMARK OFFICE
CERTIFICATE OF CORRECTION

PATENT NO. : 5,244,871
DATED : September 14, 1993
INVENTOR(S) : Takeshi Sakurai, et al It is certified that error appears in the above-indentified patent and that said Letters Patent is hereby corrected as shown below:

On the title page,
item [54]: line 3, change "$(ND_x(CE_yL_z)_2$" to --$(ND_xCE_yL_z)_2$--.

On the title page, line 3, change "LA" to --CA--.

Claim 4, column 7, line 42, change "x=0.4," to --(x=0.4,--.

Signed and Sealed this

Twenty-seventh Day of September, 1994

Attest:

BRUCE LEHMAN

*Attesting Officer*     *Commissioner of Patents and Trademarks*